(12) United States Patent  
Lee et al.

(10) Patent No.: US 8,817,540 B2  
(45) Date of Patent: Aug. 26, 2014

(54) NONVOLATILE MEMORY DEVICE AND PROGRAM METHOD THEREOF

(75) Inventors: Seung-Jun Lee, Hwaseong-si (KR); Yongjoon Choi, Suwon-si (KR); Jeongseok Nam, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/611,596

(22) Filed: Sep. 12, 2012

(65) Prior Publication Data

US 2013/0163326 A1 Jun. 27, 2013

(30) Foreign Application Priority Data

Dec. 26, 2011 (KR) .................. 10-2011-0142289

(51) Int. Cl.  
*G11C 11/34* (2006.01)

(52) U.S. Cl.  
USPC ............................. 365/185.14; 365/185.28

(58) Field of Classification Search  
USPC ........................ 365/185.17, 185.14  
See application file for complete search history.

(56) References Cited

U.S. PATENT DOCUMENTS

| 6,858,906 | B2 | 2/2005 | Lee et al. |
| 6,987,694 | B2 | 1/2006 | Lee |
| 7,376,017 | B2 | 5/2008 | Kim |
| 7,529,124 | B2 | 5/2009 | Cho et al. |
| 7,800,950 | B2 | 9/2010 | Park et al. |
| 7,839,688 | B2 | 11/2010 | Kim |
| 2004/0169238 | A1 | 9/2004 | Lee et al. |
| 2006/0180851 | A1 | 8/2006 | Lee et al. |
| 2007/0171719 | A1 | 7/2007 | Hemink et al. |
| 2009/0016112 | A1* | 1/2009 | Lee .................. 365/185.17 |
| 2009/0129170 | A1 | 5/2009 | Lee |
| 2010/0002520 | A1 | 1/2010 | Lee |
| 2011/0305079 | A1* | 12/2011 | Park et al. .............. 365/185.2 |

FOREIGN PATENT DOCUMENTS

KR 100673020 1/2007

* cited by examiner

*Primary Examiner* — Anthan Tran  
(74) *Attorney, Agent, or Firm* — Myers Bigel Sibley & Sajovec, P.A.

(57) ABSTRACT

Methods of operating nonvolatile memory devices are described. A bit line program voltage is applied to at least one selected bit line and a bit line program-inhibition voltage is applied to at least one unselected bit line. The methods further include concurrently applying a word line program voltage to a selected word line, a first pass voltage to at least one unselected word line and a second pass voltage less than the first pass voltage to at least one unselected word line immediately adjacent the selected word line on a string selection line side of the selected word line.

13 Claims, 19 Drawing Sheets

NONVOLATILE MEMORY DEVICE AND PROGRAM METHOD THEREOF

CROSS-REFERENCE TO RELATED APPLICATIONS

The present application claims priority under 35 U.S.C §119 to Korean Patent Application No. 10-2011-0142289 filed Dec. 26, 2011, the entirety of which is incorporated by reference herein.

BACKGROUND

The inventive subject matter described herein relates to semiconductor memory devices and, more particularly, to methods of programming nonvolatile memory devices.

Semiconductor memory devices are a vital microelectronic component commonly found in digital logic systems, such as computers and microprocessor-based applications ranging from satellites to consumer electronics. Therefore, advances in the fabrication of semiconductor memory devices, including process enhancements and circuit-design-related developments that allow scaling to higher memory densities and faster operating speeds, help establish performance standards for other digital logic families.

Semiconductor memory devices generally include volatile memory devices, such as random access memory (RAM) devices and nonvolatile memory devices. In RAM devices, data is stored by either establishing the logic state of a bistable flip-flop such as in a static random access memory (SRAM), or by charging a capacitor in a dynamic random access memory (DRAM). In both SRAM and DRAM devices, data remains stored and may be read as long as the power is applied, but data is lost when the power is turned off.

Mask Read-Only Memory (MROM), Programmable Read-Only Memory (PROM), Erasable Programmable Read-Only Memory (EPROM) and Electrically Erasable Programmable Read-Only Memory (EEPROM) devices are capable of storing the data, even with the power turned off. The non-volatile memory data storage state may be permanent or reprogrammable, depending upon the fabrication technology used. Nonvolatile semiconductor memories are used to store program and microcode storage in a wide variety of applications in the computer, avionics, telecommunications, and consumer electronics industries. A combination of single-chip volatile as well as nonvolatile memory storage modes is also available in devices such as nonvolatile SRAM (nvSRAM) for use in systems that require fast, reprogrammable nonvolatile memory. In addition, dozens of special memory architectures have evolved which contain some additional logic circuitry to optimize their performance for application-specific tasks.

Mask Read-Only Memory (MROM), Programmable Read-Only Memory (PROM) and Erasable Programmable Read-Only Memory (EPROM) nonvolatile memory devices are typically not erased or written to by the system in which they are installed. In contrast, Electrically Erasable Programmable Read-Only Memory (EEPROM) nonvolatile memory devices are electrically erasable and writable, and may, thus, be readily applied to auxiliary memories or system programming memories that require continuous update.

SUMMARY

Some embodiments of the inventive subject matter provide methods of operating a nonvolatile memory device having a plurality of strings of memory cells, respective bit lines coupled to respective ones of the strings, and a plurality of word lines coupled to the strings. A bit line program voltage is applied to at least one selected bit line and a bit line program-inhibition voltage is applied to at least one unselected bit line. The methods further include concurrently applying a word line program voltage to a selected word line, a first pass voltage to at least one unselected word line and a second pass voltage less than the first pass voltage to at least one unselected word line immediately adjacent the selected word line on a string selection line side of the selected word line.

The methods may further include applying a third pass voltage greater than the first pass voltage to at least one unselected word line immediately adjacent the selected word line on a ground selection line side of the selected word line. In some embodiments, a junction field formed toward a bit line side from a string channel is reduced by the second and third pass voltages. The third pass voltage may reduce local boosting of a channel of a memory cell connected to the selected word line.

In some embodiments, applying a third pass voltage greater than the first pass voltage to at least one unselected word line immediately adjacent the selected word line on a ground selection line side of the selected word line may include applying the third voltage to at least two unselected word lines immediately adjacent the selected word line.

The methods may further include performing a local self-boosting to at least one unselected word line.

The methods may also include applying a dummy word line voltage less than or equal to the second pass voltage to a dummy word line on the string selection line side of the selected word line.

Further embodiments provide methods of operating a memory device including applying a bit line program voltage to at least one selected bit line and a bit line program-inhibition voltage to at least one unselected bit line and concurrently applying a word line program voltage to a selected word line, a first pass voltage to at least one unselected word line and a second pass voltage greater than the first pass voltage to at least one unselected word line immediately adjacent the selected word line on a ground selection line side of the selected word line. The methods may further include applying an third pass voltage less than the first pass voltage to at least one unselected word line immediately adjacent the selected word line on a string selection line side of the selected word line. The methods may also include applying a dummy word line voltage less than or equal to the second pass voltage to a dummy word line on the string selection side of the selected word line.

Further embodiments of the inventive subject matter provide methods of operating a memory device including applying a bit line program voltage to at least one selected bit line and a bit line program-inhibition voltage to at least one unselected bit line and concurrently applying a word line program voltage to a selected word line, a first pass voltage to a first unselected word line and respective second and third pass voltages different from the first pass voltage to respective unselected second and third word lines immediately adjacent the selected word line on respective ones of a string selection line side of the selected word line and a ground selection line side of the selected word line. The second pass voltage may be less than the first pass voltage and the third pass voltage may be greater than the first pass voltage. Concurrently applying a word line program voltage to a selected word line, a first pass voltage to a first unselected word line and respective second and third pass voltages different from the first pass voltage to respective unselected second and third word lines immediately adjacent the selected word line on respective ones of a string selection line side of the selected word line and a ground selection line side of the selected word line may include concurrently applying the word line program voltage to the selected word line, the first pass voltage to the first unselected word line, the second pass voltage to the second unselected word lines, the third pass voltage to the third unselected word line, and a dummy word line voltage less than or equal to the second pass voltage to a dummy word line disposed on the string selection side of the selected word line. In some embodiments, concurrently applying a word line program voltage to a selected word line, a first pass voltage to a first unselected word line and respective second and third pass voltages different from the first pass voltage to respective unselected second and third word lines immediately adjacent the selected word line on respective ones of a string selection line side of the selected word line and a ground selection line side of the selected word line may include concurrently applying the word line program voltage to the selected word line, the first pass voltage to the first unselected word line, the second pass voltage to the second unselected word lines, the third pass voltage to the third unselected word line, and a local boosting word line voltage to an unselected word line on the ground selection line side of the selected word line.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
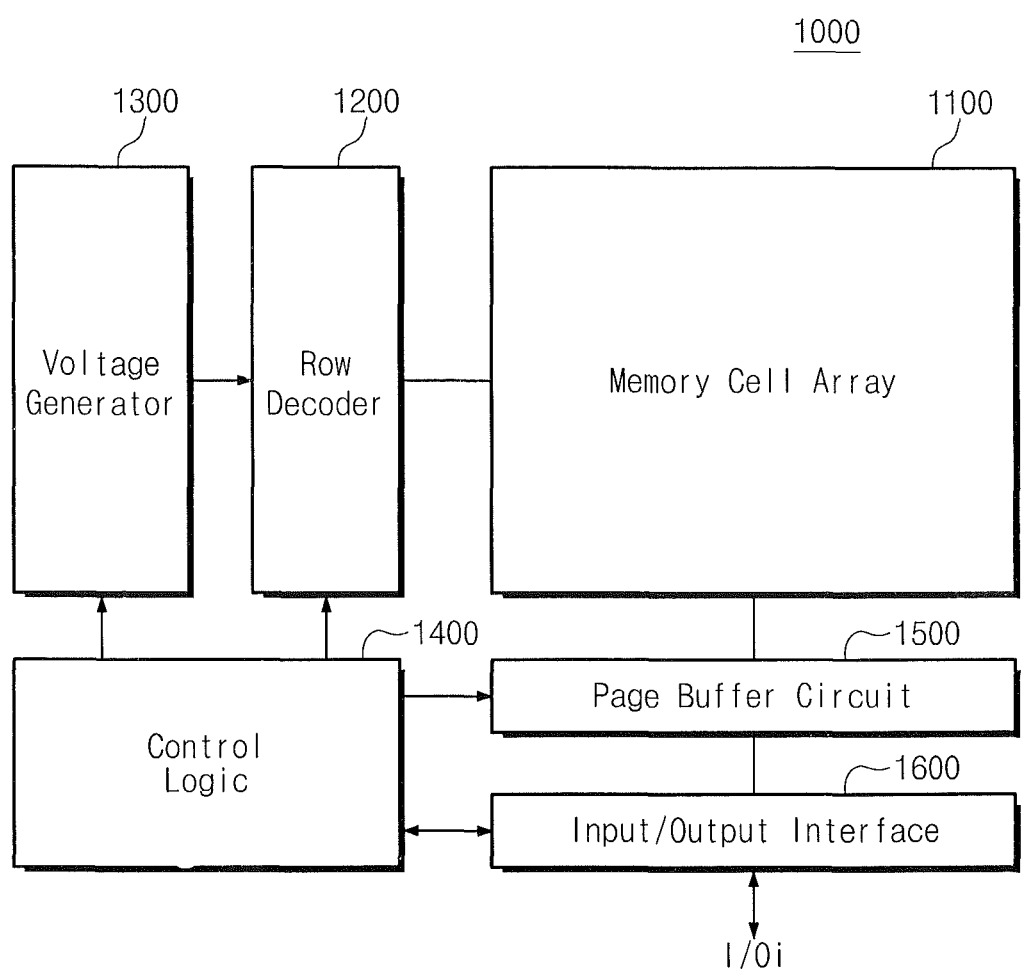
FIG. 1 is a block diagram schematically illustrating a nonvolatile memory device according to some embodiments of the inventive subject matter.

The inventive subject matter is described more fully hereinafter with reference to the accompanying drawings, in which embodiments of the inventive subject matter are shown. This inventive subject matter may, however, be embodied in many different forms and should not be construed as limited to the embodiments set forth herein. Rather, these embodiments are provided so that this disclosure will be thorough and complete and will fully convey the scope of the inventive subject matter to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive subject matter.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive subject matter. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent" another element or layer, it can be directly on, connected, coupled, or adjacent the other element or layer, or intervening elements or layers may be present. In contrast, when an element is referred to as being "directly on," "directly connected to", "directly coupled to", or "immediately adjacent" another element or layer, there are no intervening elements or layers present.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a nonvolatile memory device according to some embodiments of the inventive subject matter.

Referring to FIG. 1, a nonvolatile memory device 1000 may include a memory cell array 1100, a row decoder 1200, a voltage generator 1300, control logic 1400, a page buffer circuit 1500, and an input/output interface 1600.

The memory cell array 1100 may include memory cells arranged at intersections of rows (e.g., word lines) and columns (e.g., bit lines). Each memory cell may store 1-bit data or multi-bit data (M being an integer of 2 or more). The row decoder 1200 may be controlled by the control logic 1400 and may perform selecting and driving operations on rows (e.g., word lines, a string selection line(s), a ground selection line(s), a common source line, etc.) of the memory cell array 1100.

The voltage generator 1300 may be controlled by the control logic 1400 and may generate voltages required for each operation such as a high voltage, a program voltage, a read voltage, a verification voltage, an erase voltage, a pass voltage, a bulk voltage, and the like. In particular, in program operations, the voltage generator 1300 may be configured to generate a program voltage and a plurality of pass voltages according to the control of the control logic 1400. The plurality of pass voltages may be different in level from one another. For example, the plurality of pass voltages may include a default pass voltage as a pass voltage being normally used, a upper pass voltage lower by a predetermined voltage (e.g., about 1V) than the default pass voltage, a lower pass voltage higher by a predetermined voltage (e.g., about 1V) than the default pass voltage, and the like.

Voltages generated by the voltage generator 1300 are provided to the memory cell array 1100 via the row decoder 1200. The control logic 1400 is configured to control an overall operation of the nonvolatile memory device 1000. In program operations, the control logic 1400 may control the row decoder 1200 so as to transfer a program voltage to a selected word line, a upper pass voltage to an unselected upper word line adjacent the selected word line, a lower pass voltage to an unselected lower word line adjacent the selected word line and a default pass voltage to the remaining unselected word lines. In program operations according to some embodiments, the control logic 1400 may control the row decoder 1200 so as to transfer the program voltage to a selected word line, the upper pass voltage to an unselected upper word line adjacent the selected word line and the default pass voltage to the remaining unselected word lines. In program operations according to further embodiments, the control logic 1400 may control the row decoder 1200 so as to transfer the program voltage to a selected word line, the lower pass voltage to an unselected lower word line adjacent the selected word line and the default pass voltage to the remaining unselected word lines. However, it is well understood that bias conditions of word lines are not limited to the specific examples described herein.

The page buffer circuit 1500 may be controlled by the control logic 1400 and may be configured to read data from the memory cell array 1100 and to drive columns (e.g., bit lines) of the memory cell array 1100 according to program data. The page buffer circuit 1500 may include page buffers respectively corresponding to bit lines or bit line pairs. Each of the page buffers may include a plurality of latches. The input/output interface 1600 may be controlled by the control logic 1400 and may interface with an external device. The input/output interface 1600 may include a column decoder configured to select page buffers of the page buffer circuit 1500 by a predetermined unit, an input buffer receiving data, an output buffer outputting data, and the like.

Figure 2:
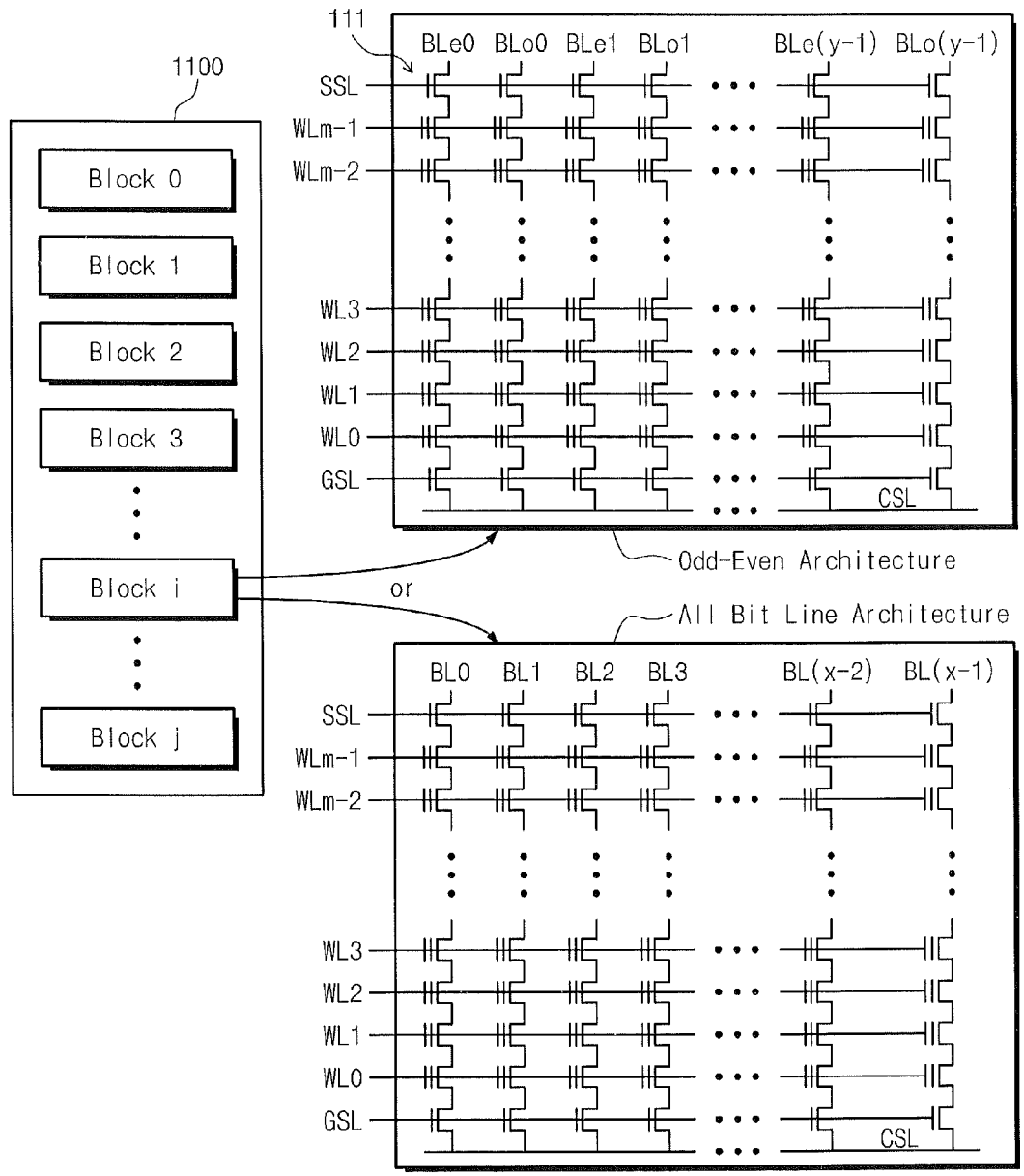
FIG. 2 is a diagram schematically illustrating a memory cell array having an all bit line memory architecture or the odd-even memory architecture.

FIG. 2 is a diagram schematically illustrating a memory cell array having an all bit line memory architecture or an odd-even memory architecture. Exemplary structures of a memory cell array 1100 will be described. As one example, a NAND flash memory device including a memory cell array 1100 partitioned into 1,024 blocks will now be described. The data stored in each block may be simultaneously erased. In some embodiments, the memory block may be the minimum unit of storage elements that are simultaneously erased. Each memory block, for example, may have columns each corresponding to bit lines (e.g., bit lines of 1 KB). In some embodiments referred to as using an all bit line (ABL) architecture, all the bit lines of a memory block may be capable of being simultaneously selected during read and program operations. Storage elements in a common word line and connected to all bit lines may be capable of being programmed at the same time.

In some embodiments, a plurality of storage elements in the same column may be connected in series to form a NAND string 111. One end of the NAND string 111 may be connected to a corresponding bit line via a selection transistor which is controlled by a string selection line SSL and the other end may be connected to a common source line CSL via a selection transistor which is controlled by a ground selection line GSL.

In some embodiments referred to as having an odd-even architecture, bit lines may be divided into even bit lines (BLe) and odd bit lines (BLo). In the odd/even bit line architecture, storage elements in a common word line and connected to the odd bit lines may be programmed at a first time, while storage elements in the common word line and connected to even bit lines may be programmed at a second time. Data can be programmed and read into and from different blocks. Such operations are capable of being performed at the same time.

Figure 3:
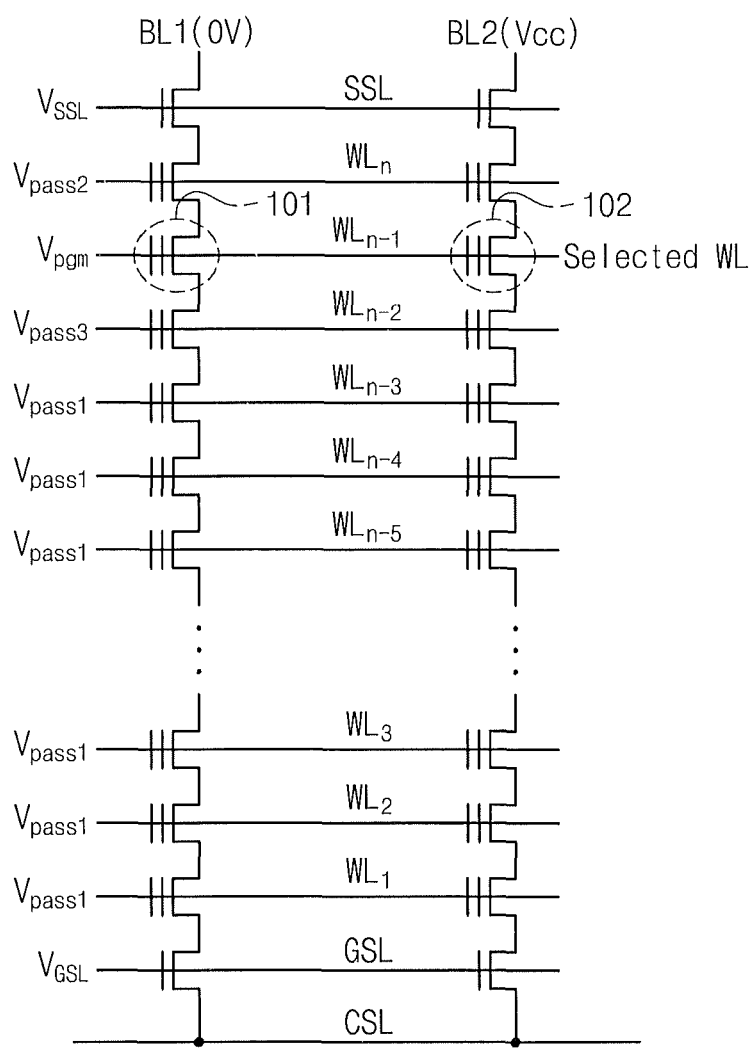
FIG. 3 is a diagram describing program operations of a nonvolatile memory device according to some embodiments of the inventive subject matter.

FIG. 3 is a diagram describing program operations of a nonvolatile memory device according to some embodiments of the inventive subject matter. For ease of description, two strings respectively corresponding to two bit lines BL1 and BL2 are illustrated in FIG. 3. It is assumed that a word line WLn-1 is a selected word line.

A page buffer circuit 1500 may drive a bit line with a bit line program voltage (e.g., 0V) or a bit line program inhibition voltage (e.g., a power supply voltage) according to program data. For example, the bit line BL1 may be driven with the bit line program voltage and the bit line BL2 may be driven with the bit line program inhibition voltage.

A string selection line SSL may be driven with a voltage sufficient to turn on a string selection transistor and a ground selection line GSL may be driven with a ground voltage. With this bias condition, a channel of a string including a memory cell 101 to be programmed may be electrically connected to the bit line BL1, while a channel of a string including a memory cell 102 to be program inhibited may be electrically isolated from the bit line BL2. A channel of a string electrically isolated from the bit line BL2 may be boosted under the following program bias condition, so that the memory cell 102 may be program inhibited.

According to some embodiments of the inventive subject matter, the selected word line WLn-1 may be driven with a program voltage Vpgm and unselected word lines WL1 to WLn-3 may be driven with a first pass voltage Vpass1. An unselected upper word line WLn immediately adjacent the selected word line WLn-1 toward the string selection line SSL may be driven with a second pass voltage Vpass2 that is less than the first pass voltage Vpass1. An unselected lower word line WLn-2 immediately adjacent the selected word line WLn-1 toward the ground selection line GSL may be driven with a third pass voltage Vpass3 greater than the second pass voltage Vpass2 and the first pass voltage Vpass1.

In case of a typical conventional program bias condition where unselected word lines are driven by the same pass voltage (e.g., a voltage corresponding to the first pass voltage Vpass1), a junction field may be generated toward a string selection line side from a channel of a string. The junction field may cause generation of a leakage current. That is, the junction field may lower a boosted voltage of a channel. In case of the typical conventional program bias condition, the program-inhibited memory cell 102 may suffer program disturbance due to the junction field. This may force a threshold voltage distribution to widen. Thus, when program operations are executed according to the typical conventional program bias condition, many fail bits may be generated due to memory cells (in particular, program-inhibited memory cells) of word lines adjacent the string selection line SSL.

However, in program operations according to some embodiments of the inventive subject matter, it is possible to blunt the junction field generated toward a string selection line side from a string channel by providing the second pass voltage Vpass2 less than the first pass voltage Vpass1 to an unselected word line adjacent a string selection line side or an unselected upper word line immediately adjacent a selected word line and providing an upper pass voltage Vpass3 greater than the first pass voltage Vpass1, to an unselected lower word line immediately adjacent the selected word line. A leakage current caused due to lowering of a boosted voltage of a channel may be reduced by reducing the junction field. As a result, it is possible to reduce the likelihood that the program-inhibited memory cell 102 will be programmed.

Further, it is possible to reduce local boosting of a channel voltage by driving an unselected lower word line immediately adjacent a selected word line with the third pass voltage Vpass3 greater than the first pass voltage Vpass1. When channels of memory cells (in particular, program-inhibited memory cells) connected to a selected word line WLn-1 are locally boosted, the above-described junction field may become strong. This may cause an increase in a leakage current. However, local boosting of a channel voltage may be reduced by driving an unselected lower word line immediately adjacent a selected word line with the third pass voltage Vpass3 greater than the first pass voltage Vpass1. It may be very useful for the case that a memory cell connected to an unselected lower word line immediately adjacent a selected word line is programmed to have a high threshold voltage.

Figure 4:
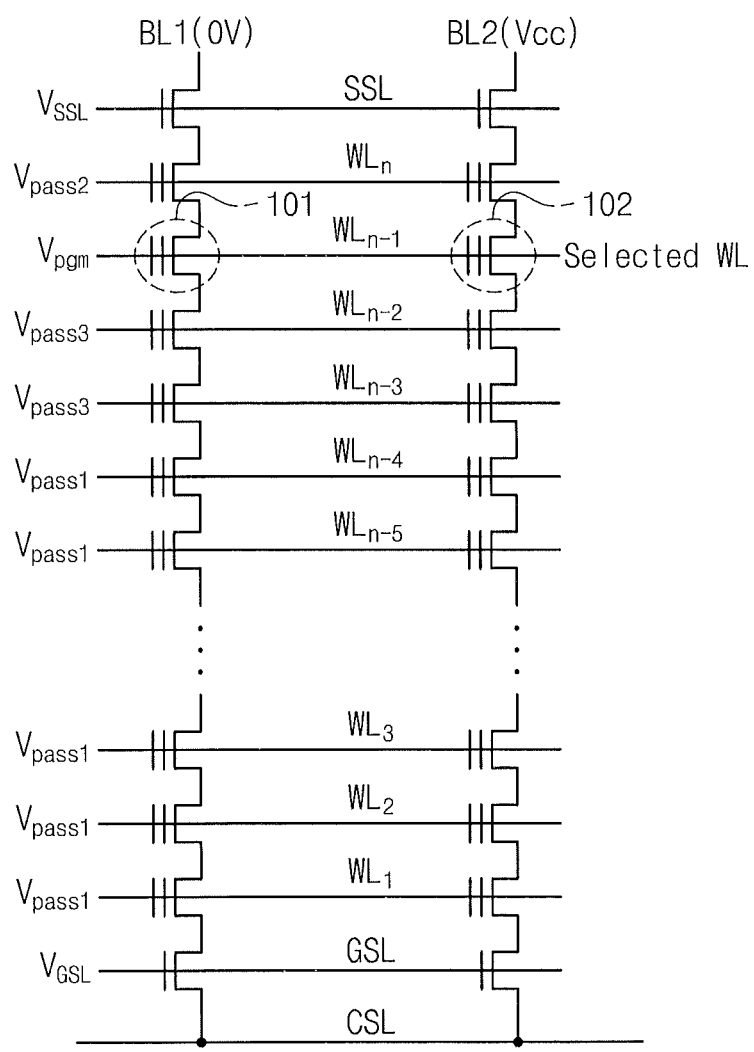
FIG. 4 is a diagram describing program operations of a nonvolatile memory device according to further embodiments of the inventive subject matter.

FIG. 4 is a diagram describing program operations of a nonvolatile memory device according to some embodiments of the inventive subject matter. For ease of description, two strings respectively corresponding to two bit lines BL1 and BL2 are illustrated in FIG. 4. It is assumed that a word line WLn-1 is a selected word line.

A page buffer circuit 1500 may drive a bit line with a bit line program voltage (e.g., 0V) or a bit line program inhibition voltage (e.g., a power supply voltage) according to program data. For example, the bit line BL1 may be driven with the bit line program voltage and the bit line BL2 may be driven with the bit line program inhibition voltage. A string selection line SSL may be driven with a voltage sufficient to turn on a string selection transistor and a ground selection line GSL may be driven with a ground voltage. With this bias condition, a channel of a string including a memory cell 101 to be programmed may be electrically connected to the bit line BL1, while a channel of a string including a memory cell 102 to be program inhibited may be electrically isolated from the bit line BL2. A channel of a string electrically isolated from the bit line BL2 may be boosted under the following program bias condition, so that the memory cell 102 may be program inhibited.

According to some embodiments of the inventive subject matter, the selected word line WLn-1 may be driven with a program voltage Vpgm. Unselected word lines WL1 to WLn-4 may be driven with a first pass voltage Vpass1 and an unselected upper word line WLn immediately adjacent the selected word line WLn-1 toward the string selection line SSL may be driven with a second pass voltage Vpass2 that is less than the first pass voltage Vpass1. Further, unselected lower word lines WLn-2 and WLn-3 immediately adjacent the selected word line WLn-1 toward the ground selection line GSL may be driven with a third pass voltage Vpass3 greater than the second pass voltage Vpass2 and first pass voltage Vpass1.

Using a program bias condition according to some embodiments of the inventive subject matter, it is possible to blunt the junction field generated toward a string selection line side from a string channel by providing the second pass voltage Vpass2 less than the first pass voltage Vpass1, to an unselected word line adjacent a string selection line side or an unselected upper word line immediately adjacent a selected word line and providing a third pass voltage Vpass3, greater than the first pass voltage Vpass1, to unselected lower word lines immediately adjacent the selected word line. A leakage current caused due to lowering of a boosted voltage of a channel may be reduced by reducing the junction field. As a result, it is possible to reduce the likelihood that the program-inhibited memory cell 102 will be programmed. Further, it is possible to reduce local boosting of a channel voltage by driving unselected lower word lines immediately adjacent a selected word line with the third pass voltage Vpass3 greater than the first pass voltage Vpass1. This bias condition may be very useful for the case that a memory cell connected to an unselected lower word line immediately adjacent a selected word line is programmed to have a high threshold voltage.

Figure 5:
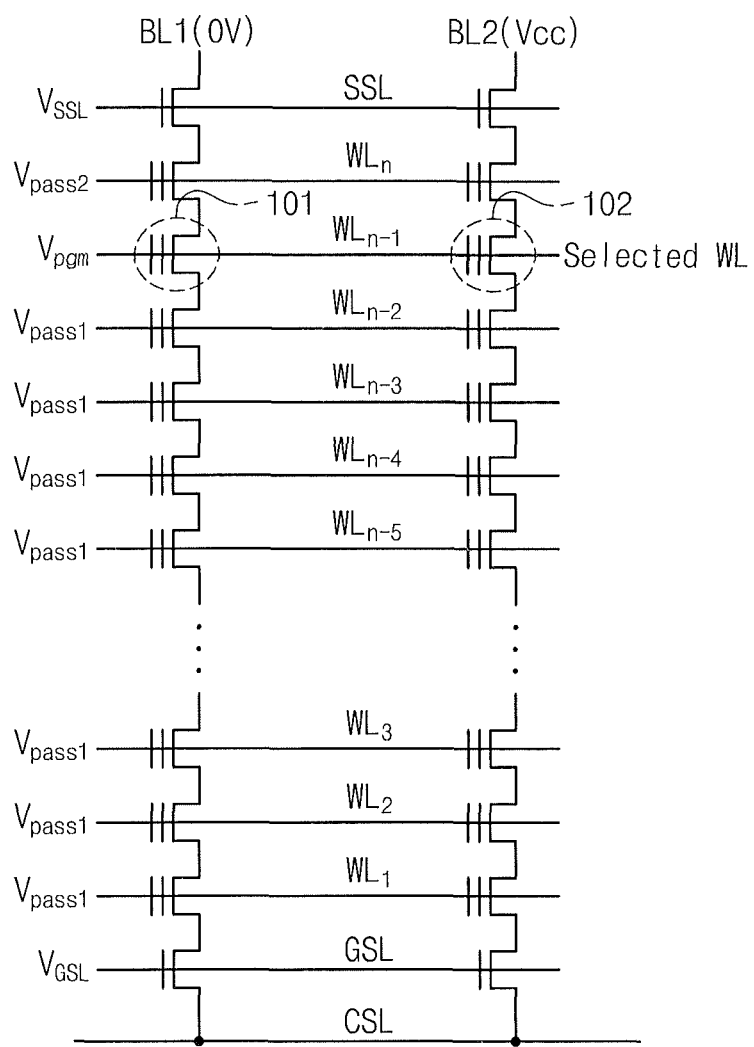
FIG. 5 is a diagram describing program operations of a nonvolatile memory device according to still further embodiments of the inventive subject matter.

FIG. 5 is a diagram describing program operations of a nonvolatile memory device according to still further embodiments of the inventive subject matter. For ease of description, two strings respectively corresponding to two bit lines BL1 and BL2 are illustrated in FIG. 5. It is assumed that a word line WLn-1 is a selected word line.

A page buffer circuit 1500 may drive a bit line with a bit line program voltage (e.g., 0V) or a bit line program inhibition voltage (e.g., a power supply voltage) according to program data. For example, the bit line BL1 may be driven with the bit line program voltage and the bit line BL2 may be driven with the bit line program inhibition voltage. A string selection line SSL may be driven with a voltage sufficient to turn on a string selection transistor and a ground selection line GSL may be driven with a ground voltage. With this bias condition, a channel of a string including a memory cell 101 to be programmed may be electrically connected to the bit line BL1, while a channel of a string including a memory cell 102 to be program inhibited may be electrically isolated from the bit line BL2. A channel of a string electrically isolated from the bit line BL2 may be boosted under the following program bias condition, so that the memory cell 102 may be program inhibited.

In some embodiments of the inventive subject matter, the selected word line WLn-1 may be driven with a program voltage Vpgm. Unselected word lines WL1 to WLn-2 may be driven with a first pass voltage Vpass1. An unselected upper word line WLn immediately adjacent the selected word line WLn-1 towards the string selection line SSL may be driven with a second pass voltage Vpass2 that is less than the first pass voltage Vpass1.

With the program bias condition according to some embodiments of the inventive subject matter, it is possible to blunt the junction field generated toward a string selection line side from a string channel by providing the second pass voltage Vpass2 less than the first pass voltage Vpass1, to an unselected word line adjacent a string selection line side or an unselected upper word line immediately adjacent a selected word line. A leakage current caused due to lowering of a boosted voltage of a channel may be reduced by reducing the junction field. As a result, it is possible to reduce the likelihood that the program-inhibited memory cell 102 will be programmed.

Figure 6:
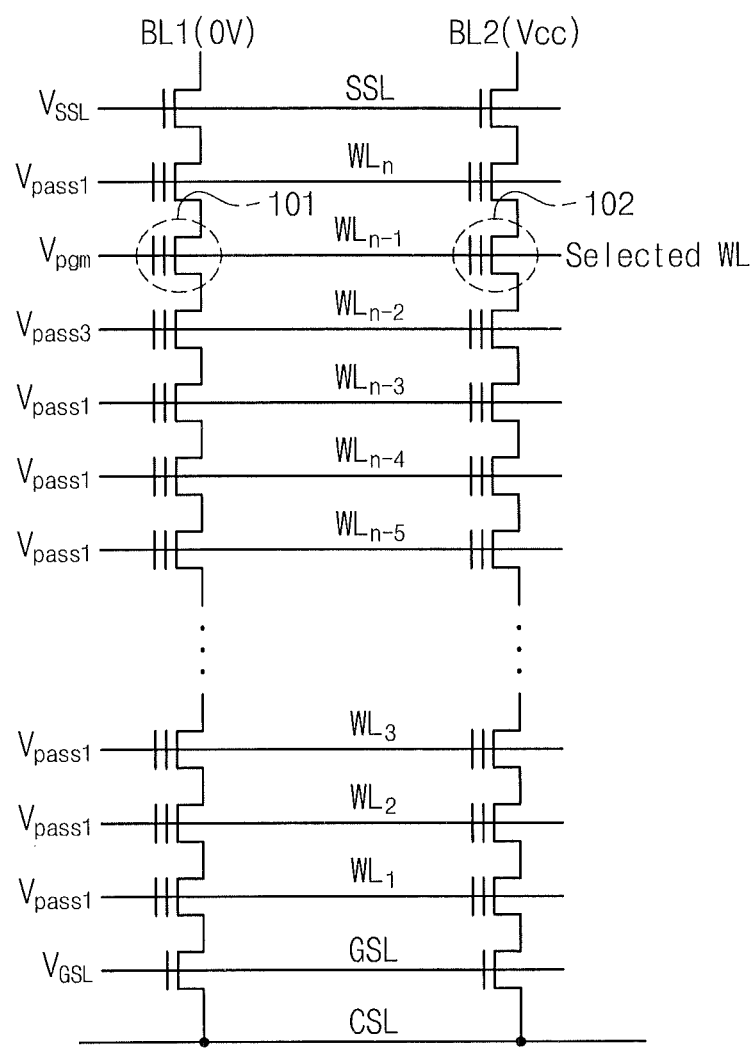
FIG. 6 is a diagram describing program operations of a nonvolatile memory device according to still further embodiments of the inventive subject matter.

FIG. 6 is a diagram describing program operations of a nonvolatile memory device according to still further embodiments of the inventive subject matter. For ease of description, two strings respectively corresponding to two bit lines BL1 and BL2 are illustrated in FIG. 6. It is assumed that a word line WLn-1 is a selected word line.

A page buffer circuit 1500 may drive a bit line with a bit line program voltage (e.g., 0V) or a bit line program inhibition voltage (e.g., a power supply voltage) according to program data. For example, the bit line BL1 may be driven with the bit line program voltage and the bit line BL2 may be driven with the bit line program inhibition voltage. A string selection line SSL may be driven with a voltage sufficient to turn on a string selection transistor and a ground selection line GSL may be driven with a ground voltage. With this bias condition, a channel of a string including a memory cell 101 to be programmed may be electrically connected to the bit line BL1, while a channel of a string including a memory cell 102 to be program inhibited may be electrically isolated from the bit line BL2. A channel of a string electrically isolated from the bit line BL2 may be boosted using the following program bias condition, so that the memory cell 102 may be program inhibited.

According to some embodiments of the inventive subject matter, the selected word line WLn-1 may be driven with a program voltage Vpgm. Unselected word lines WL1 to WLn-3 and WLn may be driven with a first pass voltage Vpass1. An unselected lower word line WLn-2 immediately adjacent the selected word line WLn-1 towards the ground selection line GSL may be driven with a third pass voltage Vpass3 that is greater than the first pass voltage Vpass1.

With such a program bias condition according to some embodiments of the inventive subject matter, it is possible to blunt the junction field generated toward a string selection line side from a string channel by providing the third pass voltage Vpass3, greater than the first pass voltage Vpass1, to an unselected lower word line immediately adjacent a selected word line. A leakage current caused due to lowering of a boosted voltage of a channel may be reduced by reducing the junction field. As a result, it is possible to reduce the likelihood that the program-inhibited memory cell 102 will be programmed. Further, it is possible to reduce local boosting of a channel voltage by driving an unselected lower word line immediately adjacent a selected word line with the third pass voltage Vpass3 greater than the first pass voltage Vpass1. This bias condition may be very useful for the case when a memory cell connected to an unselected lower word line immediately adjacent a selected word line is programmed to have a high threshold voltage.

Figure 7:
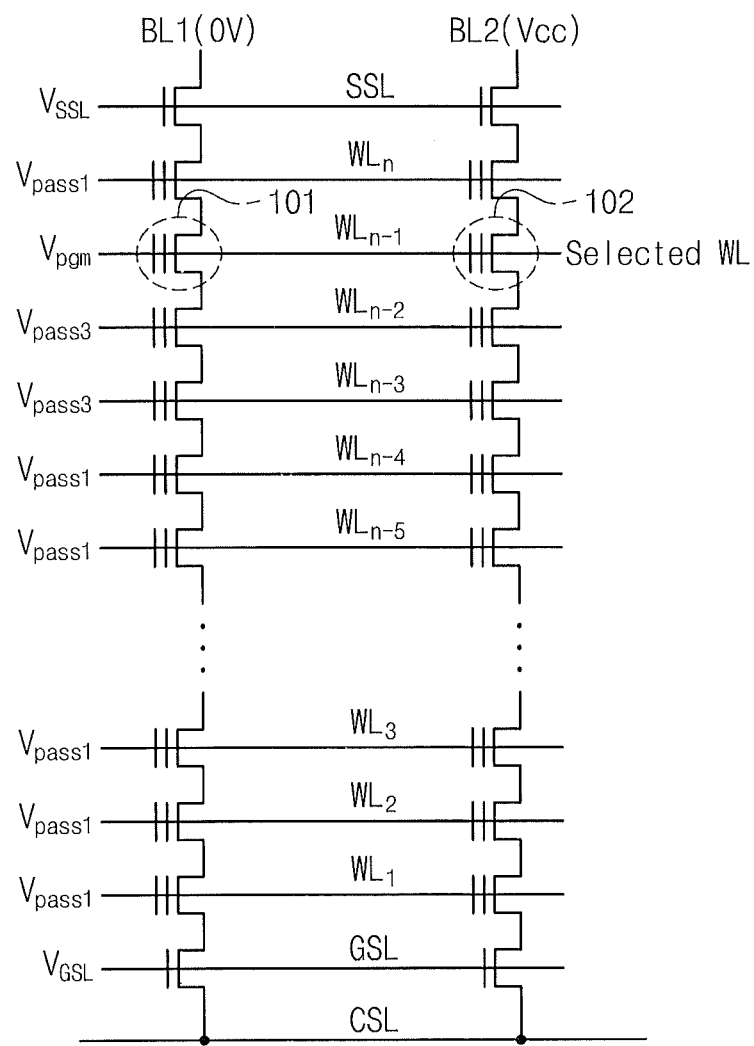
FIG. 7 is a diagram describing program operations of a nonvolatile memory device according to still further embodiments of the inventive subject matter.

FIG. 7 is a diagram describing program operations of a nonvolatile memory device according to still further embodiments of the inventive subject matter. For ease of description, two strings respectively corresponding to two bit lines BL1 and BL2 are illustrated in FIG. 7. It is assumed that a word line WLn-1 is a selected word line.

A page buffer circuit 1500 may drive a bit line with a bit line program voltage (e.g., 0V) or a bit line program inhibition voltage (e.g., a power supply voltage) according to program data. For example, the bit line BL1 may be driven with the bit line program voltage and the bit line BL2 may be driven with the bit line program inhibition voltage. A string selection line SSL may be driven with a voltage sufficient to turn on a string selection transistor and a ground selection line GSL may be driven with a ground voltage. With this bias condition, a channel of a string including a memory cell 101 to be programmed may be electrically connected to the bit line BL1, while a channel of a string including a memory cell 102 to be program inhibited may be electrically isolated from the bit line BL2. A channel of a string electrically isolated from the bit line BL2 may be boosted under the following program bias condition, so that the memory cell 102 may be program inhibited.

According to some embodiments of the inventive subject matter, the selected word line WLn-1 may be driven with a program voltage Vpgm. Unselected word lines WL1 to WLn-4 and WLn may be driven with a first pass voltage Vpass1. Unselected upper word lines WLn-2 and WLn-3 immediately adjacent the selected word line WLn-1 toward the ground selection line GSL may be driven with a third pass voltage Vpass3 that is greater than the first pass voltage Vpass1.

Using a program bias condition according to some embodiments of the inventive subject matter, it is possible to blunt the junction field generated toward a string selection line side from a string channel by providing the third pass voltage Vpass3 greater than the first pass voltage Vpass1, to unselected lower word lines immediately adjacent a selected word line on a ground selection line side. A leakage current caused due to lowering of a boosted voltage of a channel may be reduced by reducing the junction field. As a result, it is possible to reduce the likelihood that the program-inhibited memory cell 102 will be programmed. Further, it is possible to reduce local boosting of a channel voltage by driving unselected lower word lines immediately adjacent a selected word line with the third pass voltage Vpass3 greater than the first pass voltage Vpass1. This bias condition may be very useful for the case that a memory cell connected to an unselected lower word line immediately adjacent a selected word line is programmed to have a high threshold voltage.

Figure 8:
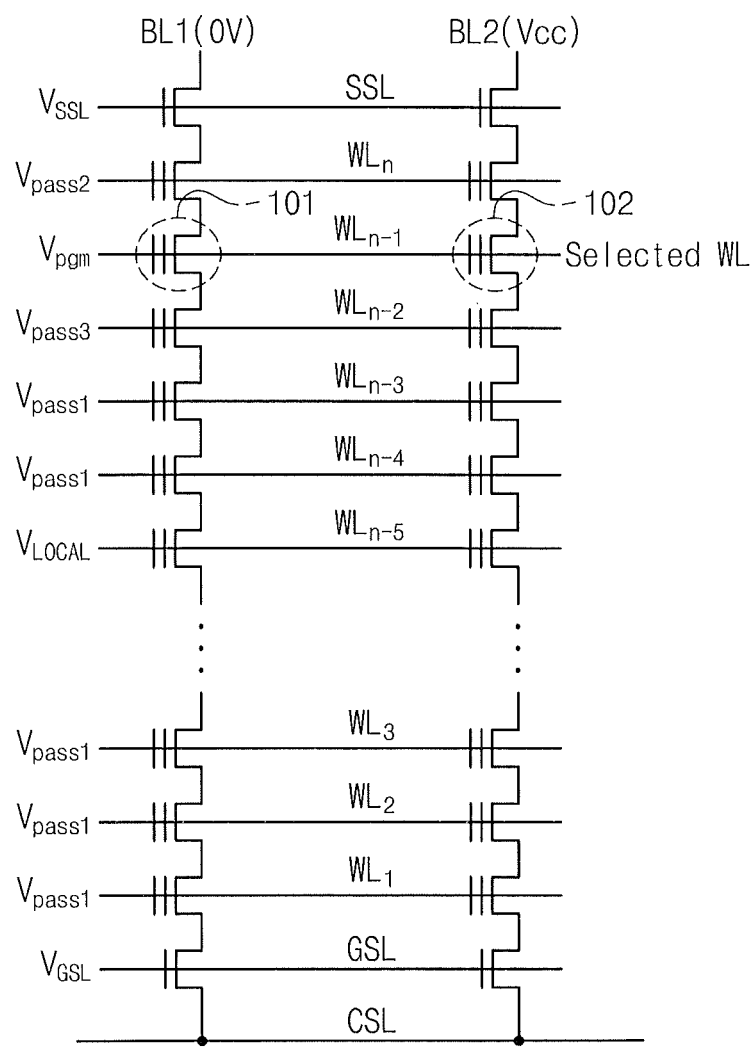
FIG. 8 is a diagram describing program operations of a nonvolatile memory device according to further embodiments of the inventive subject matter.

FIG. 8 is a diagram describing program operations of a nonvolatile memory device according to further embodiments of the inventive subject matter. For ease of description, two strings respectively corresponding to two bit lines BL1 and BL2 are illustrated in FIG. 8. It is assumed that a word line WLn-1 is a selected word line.

A page buffer circuit 1500 may drive a bit line with a bit line program voltage (e.g., 0V) or a bit line program inhibition voltage (e.g., a power supply voltage) according to program data. For example, the bit line BL1 may be driven with the bit line program voltage and the bit line BL2 may be driven with the bit line program inhibition voltage. A string selection line SSL may be driven with a voltage sufficient to turn on a string selection transistor and a ground selection line GSL may be driven with a ground voltage. With this bias condition, a channel of a string including a memory cell 101 to be programmed may be electrically connected to the bit line BL1, while a channel of a string including a memory cell 102 to be program inhibited may be electrically isolated from the bit line BL2. A channel of a string electrically isolated from the bit line BL2 may be boosted under the following program bias condition, so that the memory cell 102 may be program inhibited.

According to some embodiments of the inventive subject matter, the selected word line WLn-1 may be driven with a program voltage Vpgm. Unselected word lines WL1 to WLn-6, WLn-4, and WLn-3 may be driven with a first pass voltage Vpass1. An unselected upper word line WLn immediately adjacent the selected word line WLn-1 towards the string selection line SSL may be driven with a second pass voltage Vpass2 that is less than the first pass voltage Vpass1. Further, an unselected lower word line WLn-2 immediately adjacent the selected word line WLn-1 toward the string selection line SSL may be driven with a third pass voltage Vpass3 greater than the second pass voltage Vpass2 and the first pass voltage Vpass1. An unselected word line WLn-5 on the string selection line side may be driven with a local voltage $V_{LOCAL}$. As the local voltage $V_{LOCAL}$ is applied to an unselected word line, a channel voltage of memory cells (in particular, program-inhibited memory cells) of the selected word line may be boosted more effectively as compared with a program method not using a local self-boosting. It is well understood that a bias condition for local self-boosting is not limited thereto. Local self-boosting techniques are disclosed in U.S. Pat. Nos. 7,800,950, 6,987,694, 7,376,017, and 7,839,688, the entirety of which is incorporated by reference herein.

With the program bias condition of the inventive subject matter, it is possible to blunt the junction field generated toward a string selection line side from a string channel by providing the second pass voltage Vpass2 less than the first pass voltage Vpass1, to an unselected word line immediately adjacent a selected word line on a string selection line side. A leakage current caused due to lowering of a boosted voltage of a channel may be reduced by reducing the junction field. As a result, it is possible to reduce the likelihood that the program-inhibited memory cell 102 will be programmed. Further, it is possible to reduce local boosting of a channel voltage by driving an unselected lower word line immediately adjacent a selected word line toward a ground selection line GSL with the third pass voltage Vpass3 that is greater than the first pass voltage Vpass1. This bias condition may be very useful for the case that a memory cell connected to an unselected lower word line immediately adjacent a selected word line is programmed to have a high threshold voltage.

Figure 9:
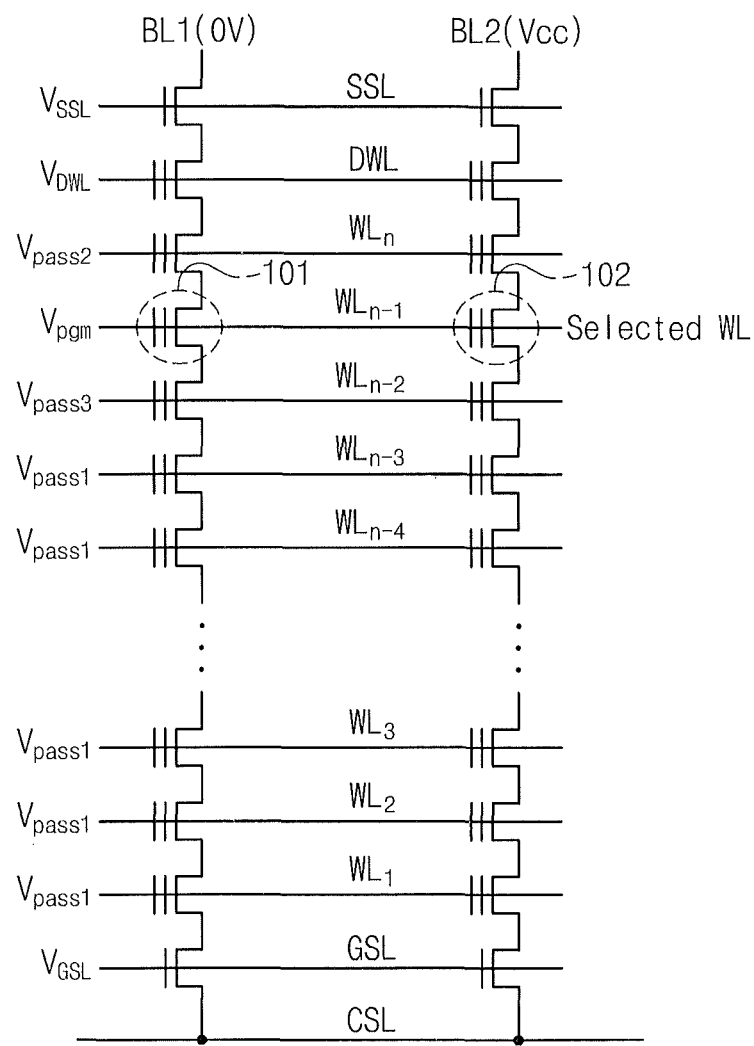
FIG. 9 is a diagram describing program operations of a nonvolatile memory device according to further embodiments of the inventive subject matter.

FIG. 9 is a diagram describing program operations of a nonvolatile memory device according to further embodiments of the inventive subject matter. For ease of description, two strings respectively corresponding to two bit lines BL1 and BL2 are illustrated in FIG. 9. It is assumed that a word line WLn-1 is a selected word line.

A page buffer circuit 1500 may drive a bit line with a bit line program voltage (e.g., 0V) or a bit line program inhibition voltage (e.g., a power supply voltage) according to program data. For example, the bit line BL1 may be driven with the bit line program voltage and the bit line BL2 may be driven with the bit line program inhibition voltage. A string selection line SSL may be driven with a voltage sufficient to turn on a string selection transistor and a ground selection line GSL may be driven with a ground voltage. With this bias condition, a channel of a string including a memory cell 101 to be programmed may be electrically connected to the bit line BL1, while a channel of a string including a memory cell 102 to be program inhibited may be electrically isolated from the bit line BL2. A channel of a string electrically isolated from the bit line BL2 may be boosted under the following program bias condition, so that the memory cell 102 may be program inhibited.

According to some embodiments of the inventive subject matter, the selected word line WLn-1 may be driven with a program voltage Vpgm. Unselected word lines WL1 to WLn-3 may be driven with a first pass voltage Vpass1. An unselected upper word line WLn adjacent the selected word line WLn-1 toward the string selection line SSL may be driven with a second pass voltage Vpass2 that is less than the first pass voltage Vpass1. An unselected lower word line WLn-2 immediately adjacent the selected word line WLn-1 toward the ground selection line GSL may be driven with a third pass voltage Vpass3 greater than the second pass voltage Vpass2 and the first pass voltage Vpass1. A dummy word line DWL may be driven with a dummy word line voltage $VD_{WL}$ less than the second pass voltage Vpass2.

Using a program bias condition according to some embodiments of the inventive subject matter, it is possible to blunt the junction field generated toward a string selection line side from a string channel by providing the second pass voltage Vpass2 less than the first pass voltage Vpass1, to an unselected word line on a string selection line side of a selected word line and providing an upper pass voltage Vpass3, greater than the first pass voltage Vpass1, to an unselected lower word line immediately adjacent the selected word line on a ground selection line side. A leakage current caused due to lowering of a boosted voltage of a channel may be reduced by reducing the junction field. As a result, it is possible to reduce the likelihood that the program-inhibited memory cell 102 will be programmed. Further, it is possible to reduce local boosting of a channel voltage by driving an unselected lower word line immediately adjacent a selected word line on a ground selection line side with the third pass voltage Vpass3 greater than the first pass voltage Vpass1. This bias condition may be very useful for the case that a memory cell connected to an unselected lower word line immediately adjacent a selected word line is programmed to have a high threshold voltage.

In the above-described embodiments, it is well understood that the number of unselected word lines being driven with a third pass voltage Vpass3 is not limited to this disclosure. For example, the number of unselected word lines being driven with a third pass voltage Vpass3 can be more than 2. The above-described embodiments can be combined variously.

For example, methods described in relation to FIGS. 3 to 7 may be applied to a manner and a structure described in relation to FIG. 8 or 9.

In example embodiments, it is possible to selectively use program methods described in relation to FIGS. 3 to 9. For example, program methods described in relation to FIGS. 3 to 9 can be selectively used according to whether a selected word line exists between a reference word line and a string selection line. In case that a selected word line does not exist between a reference word line and a string selection line, a program operation may be executed according to the typical program method. Control logic 1400 may make this selection using a row address.

Figure 10:
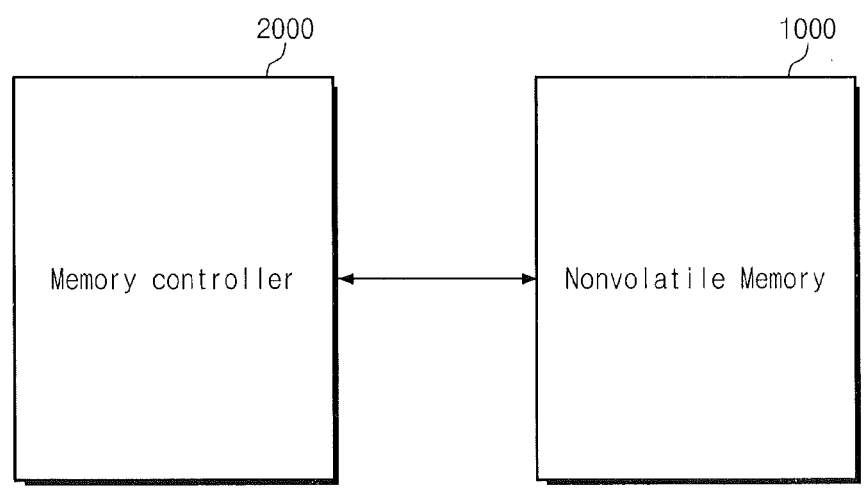
FIG. 10 is a block diagram schematically illustrating a memory system according to some embodiments of the inventive subject matter.

FIG. 10 is a block diagram schematically illustrating a memory system according to some embodiments of the inventive subject matter.

Referring to FIG. 10, a memory system according to some embodiments of the inventive subject matter may include a nonvolatile memory device 1000 and a memory controller 2000. The nonvolatile memory device 1000 may be used as a type of storage medium that stores data information. The storage medium may be formed of one or more memory chips. The nonvolatile memory device 1000 may communicate with the memory controller 2000 via one or more channels. The nonvolatile memory device 1000 may include a NAND flash memory device, for example. The controller 2000 may be configured to control the nonvolatile memory device 1000 according to a request of an external device (e.g., host) or an internal request (e.g., background operations such as merge, garbage collection, etc.). The nonvolatile memory device 1000 may be equal to that illustrated in FIG. 1 and may perform a program operation according to one of program method described in FIGS. 3 to 9.

In embodiment embodiments, it is well understood that the nonvolatile memory device 1000 is not limited to the NAND flash memory device. For example, the inventive subject matter may be applied to a NOR flash memory device, a Resistive Random Access Memory (RRAM) device, a Phase-Change Memory (PRAM) device, a Magnetroresistive Random Access Memory (MRAM) device, a Ferroelectric Random Access Memory (FRAM) device, a Spin Transfer Torque Random Access Memory (STT-RAM) and the like. Further, the nonvolatile memory device 1000 may be implemented to have a three-dimensional array structure. A nonvolatile memory device with the three-dimensional array structure may be referred to as a vertical NAND flash memory device. The inventive subject matter may be applied to a Charge Trap Flash (CTF) memory device including a charge storage layer formed of an insulation film as well as a flash memory device including a charge storage layer formed of a conductive floating gate.

Figure 11:
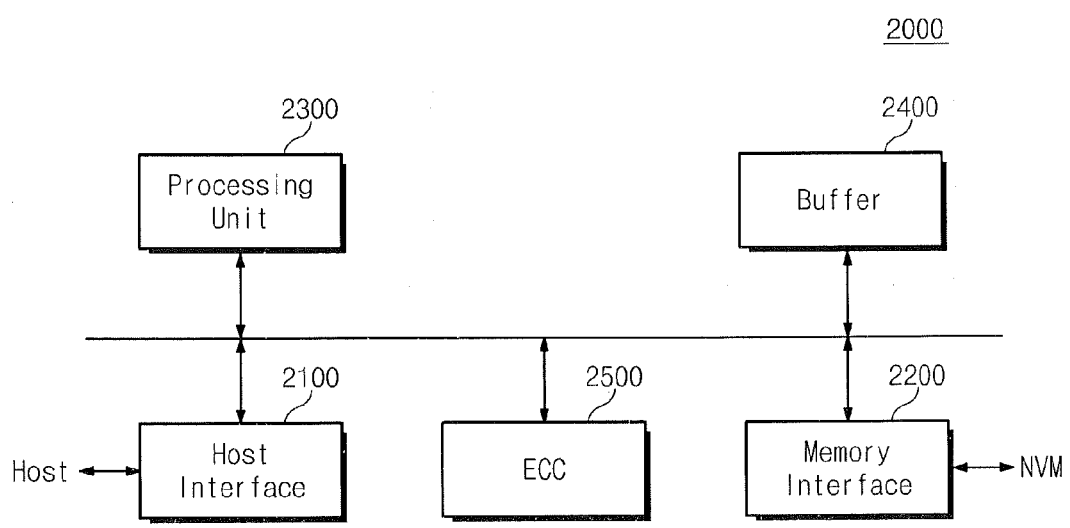
FIG. 11 is a block diagram schematically illustrating a memory controller in FIG. 10.

FIG. 11 is a block diagram schematically illustrating a memory controller in FIG. 10. Referring to FIG. 11, a memory controller 2000 may include a host interface 2100 as a first interface, a memory interface 2200 as a second interface, a processing unit 2300 such as CPU, a buffer memory 2400 and an error detecting and correcting circuit 2500.

The host interface 2100 may be configured to interface with an external device (for example, a host) and the memory interface 2200 may be configured to interface with a nonvolatile memory device 1000 illustrated in FIG. 1. The processing unit 2300, for example, CPU may be configured to control an overall operation of the memory controller 2000. The processing unit 2300 may be configured to operate firmware such as Flash Translation Layer (FTL), for example. The buffer memory 2400 may be used to temporarily store data transferred from an external device via the host interface 2100 or data transferred from the nonvolatile memory device 1000 via the memory interface 2200. The error detecting and correcting circuit 2500 may be configured to encode data to be stored in the nonvolatile memory device 1000 and to decode data read out from the nonvolatile memory device 1000. The encoding may include generating parity information. The parity information may be generated by a field unit. One-page data may be formed of one or more fields.

Although not shown in FIG. 11, the memory controller 2000 may further include a ROM, which is used to store firmware such as the FLT. In this case, the firmware in the ROM may be stored in the nonvolatile memory device 1000 controlled by the controller 2000 and may be loaded onto the memory controller 2000 from the nonvolatile memory device 1000 at power-up.

In example embodiments, the host interface 2100 may be formed of one of computer bus standards, storage bus standards and iFCPPeripheral bus standards, or a combination of two or more standards. The computer bus standards may include S-100 bus, Mbus, Smbus, Q-Bus, ISA, Zorro II, Zorro III, CAMAC, FASTBUS, LPC, EISA, VME, VXI, NuBus, TURBOchannel, MCA, Sbus, VLB, PCI, PXI, HP GSC bus, CoreConnect, InfiniBand, UPA, PCI-X, AGP, PCIe, Intel QuickPath Interconnect, Hyper Transport, etc. The storage bus standards may include ST-506, ESDI, SMD, Parallel ATA, DMA, SSA, HIPPI, USB MSC, FireWire (1394), Serial ATA, eSATA, SCSI, Parallel SCSI, Serial Attached SCSI, Fibre Channel, iSCSI, SAS, RapidIO, FCIP, etc. The iFCP-Peripheral bus standards may include Apple Desktop Bus, HIL, MIDI, Multibus, RS-232, DMX512-A, EIA/RS-422, IEEE-1284, UNI/O, 1-Wire, I2C, SPI, EIA/RS-485, USB, Camera Link, External PCIe, Light Peak, Multidrop Bus, etc.

Although not illustrated in figures, the memory controller 2000 may further include a randomizer/de-randomizer which is configured to randomize data to be stored in the nonvolatile memory device 1000 and to de-randomize data read from the nonvolatile memory device 1000. An example of the randomizer/de-randomizer is disclosed in U.S. Patent Publication No. 2010/0088574, the entirety of which is incorporated by reference herein.

Figure 12:
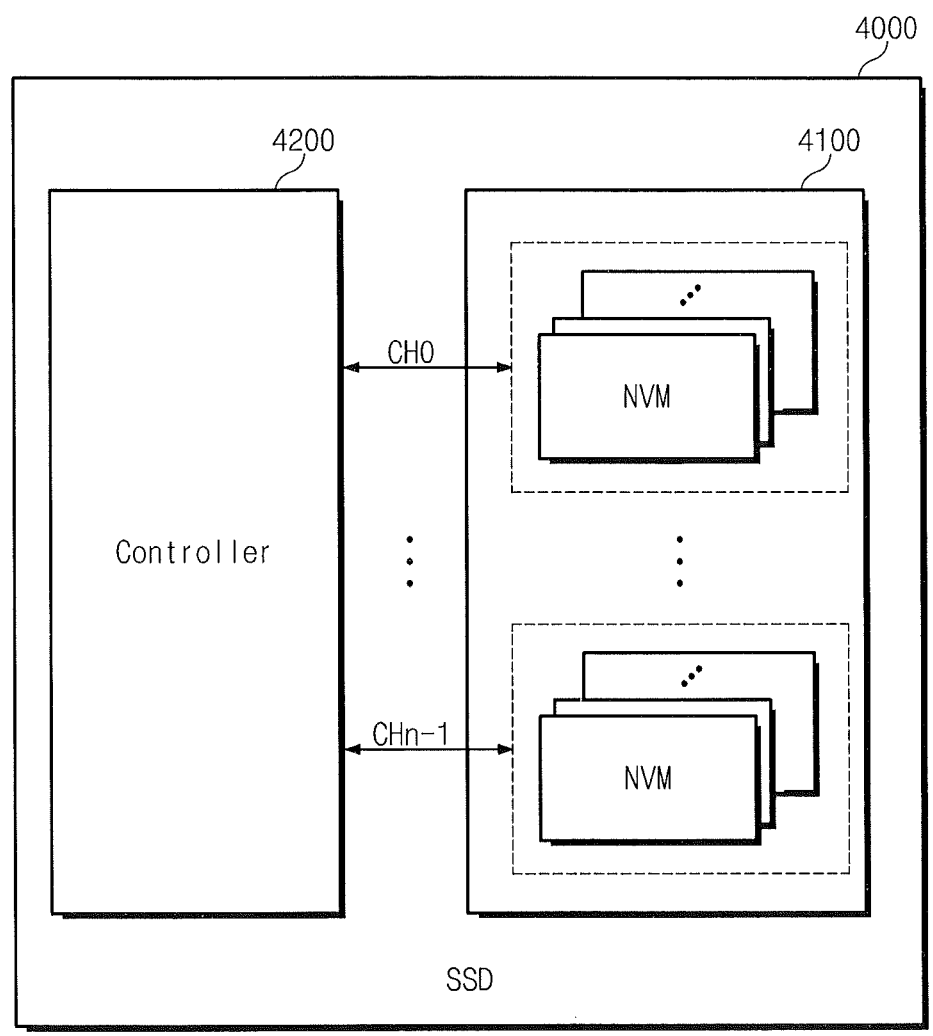
FIG. 12 is a block diagram schematically illustrating a solid state drive according to some embodiments of the inventive subject matter.

FIG. 12 is a block diagram schematically illustrating a solid-state drive according to some embodiments of the inventive subject matter.

Referring to FIG. 12, a solid-state drive (SSD) 4000 may comprise storage medium 4100 and a controller 4200. The storage medium 4100 may be connected with the controller 4200 via a plurality of channels, each of which is commonly connected with a plurality of nonvolatile memories. Each nonvolatile memory device may be formed of a memory described in FIG. 1 and may perform a program operation using one of program methods described in relation to FIGS. 3 to 9. Accordingly, it is possible to slow down a junction field generated toward a string selection line side from a string channel. As the junction field is slowed down, there may be reduced a leakage current causing lowering of a boosted voltage of a channel. As a result, it is possible to prevent a program-inhibited memory cell from being programmed.

Figure 13:
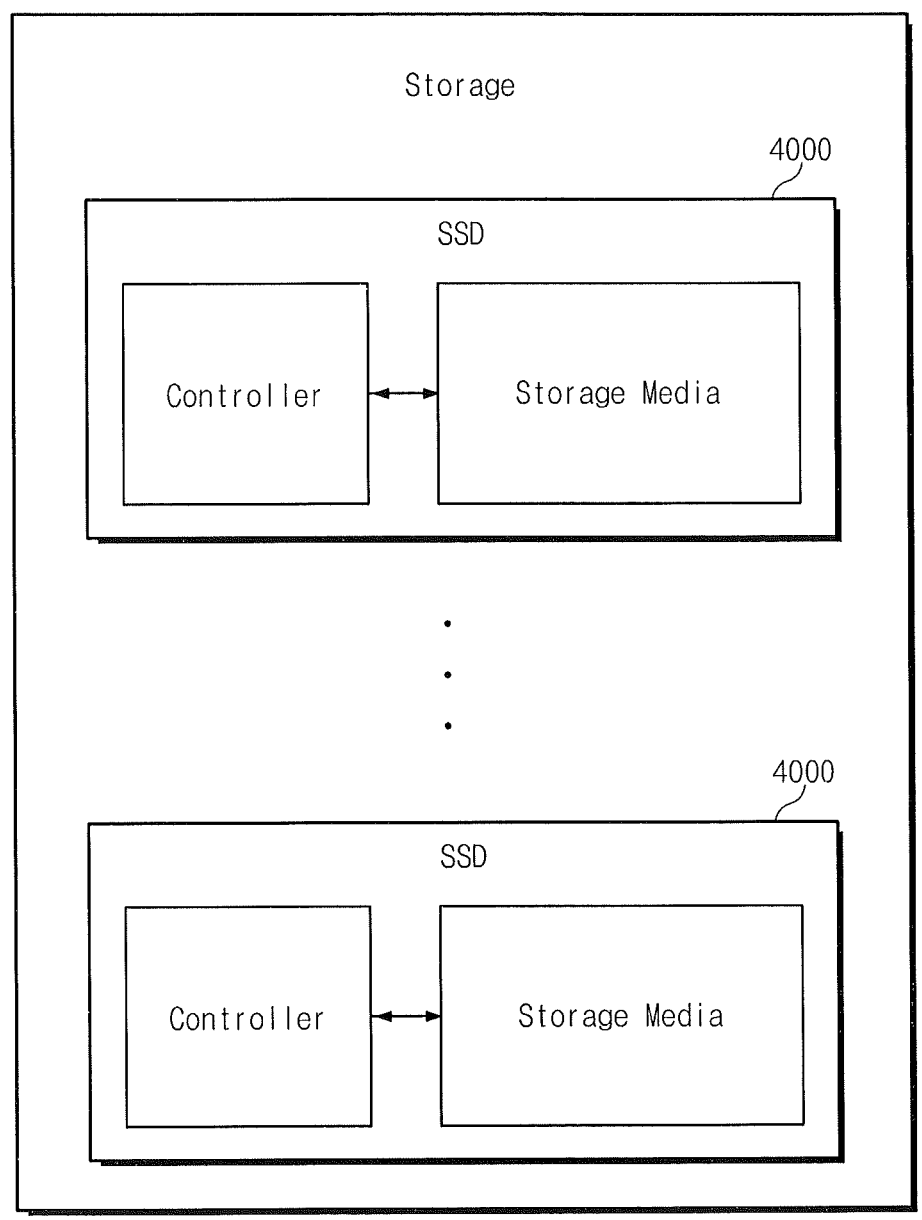
FIG. 13 is a block diagram schematically illustrating a storage apparatus using a solid state drive in FIG. 12.
Figure 14:
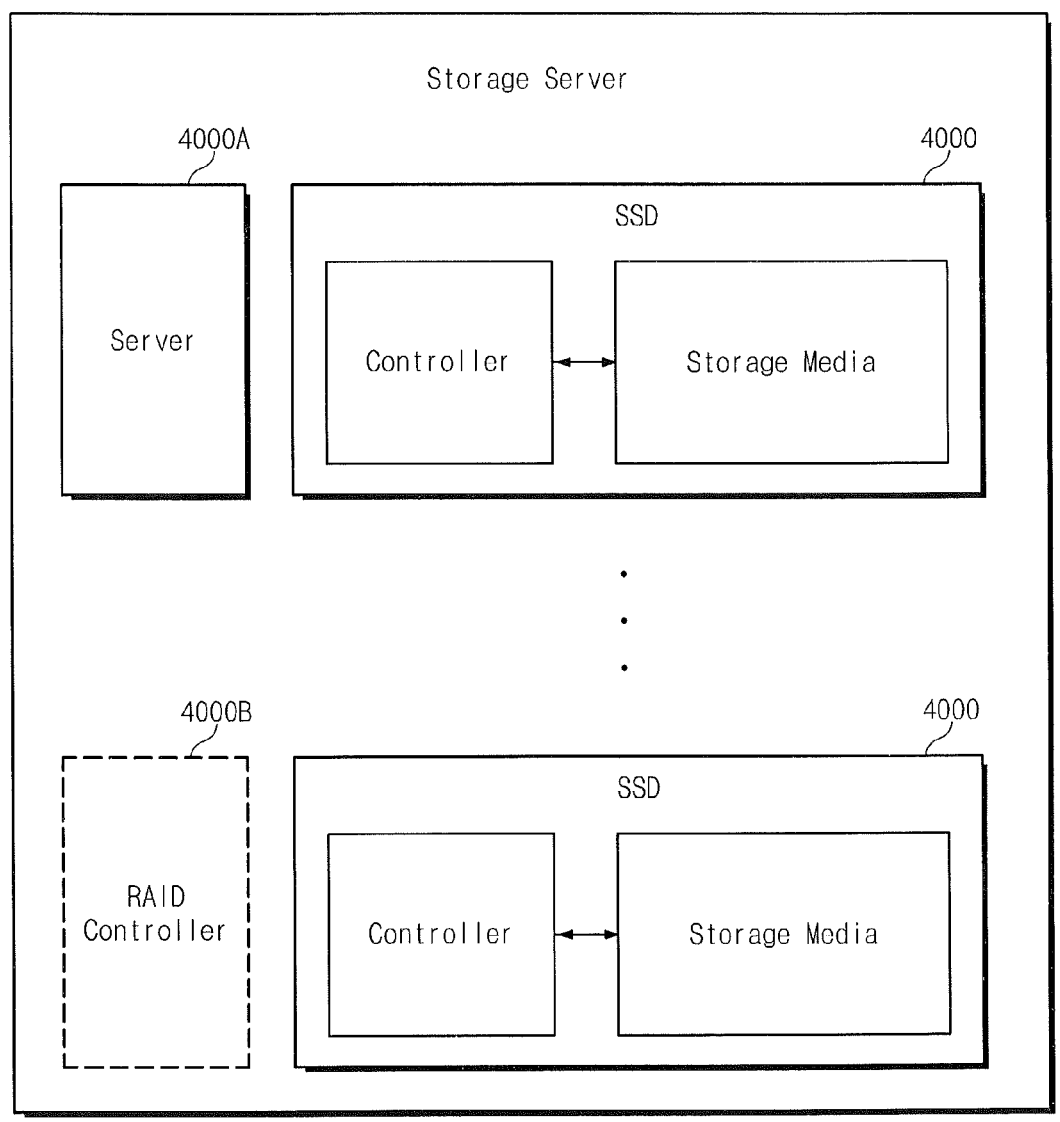
FIG. 14 is a block diagram schematically illustrating a storage server using a solid state drive in FIG. 12.

FIG. 13 is a block diagram schematically illustrating a storage apparatus using a solid state drive in FIG. 12 and FIG. 14 is a block diagram schematically illustrating a storage server using a solid state drive in FIG. 12.

An SSD 4000 according to some embodiments of the inventive subject matter may be used to form the storage. As illustrated in FIG. 13, the storage may include a plurality of solid state drives 4000 which are configured the same as described in FIG. 12. An SSD 4000 according to some embodiments of the inventive subject matter may be used to configure a storage sever. As illustrated in FIG. 14, a storage server includes a plurality of solid state drives 4000, which are configured the same as described in FIG. 12, and a server 4000A. Further, it is well comprehended that a well-known RAID controller 4000B is provided in the storage server.

Figure 15:
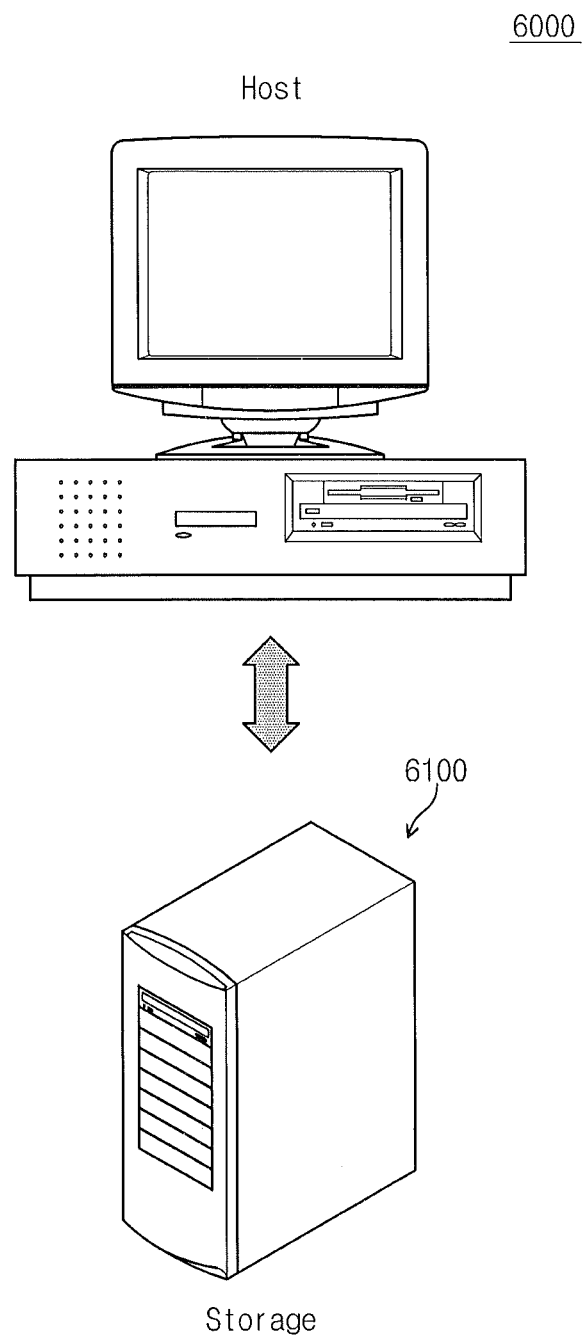
FIGS. 15 to 17 are diagrams schematically illustrating systems to which a data storage device according to embodiments of the inventive subject matter is applied.
Figure 16:
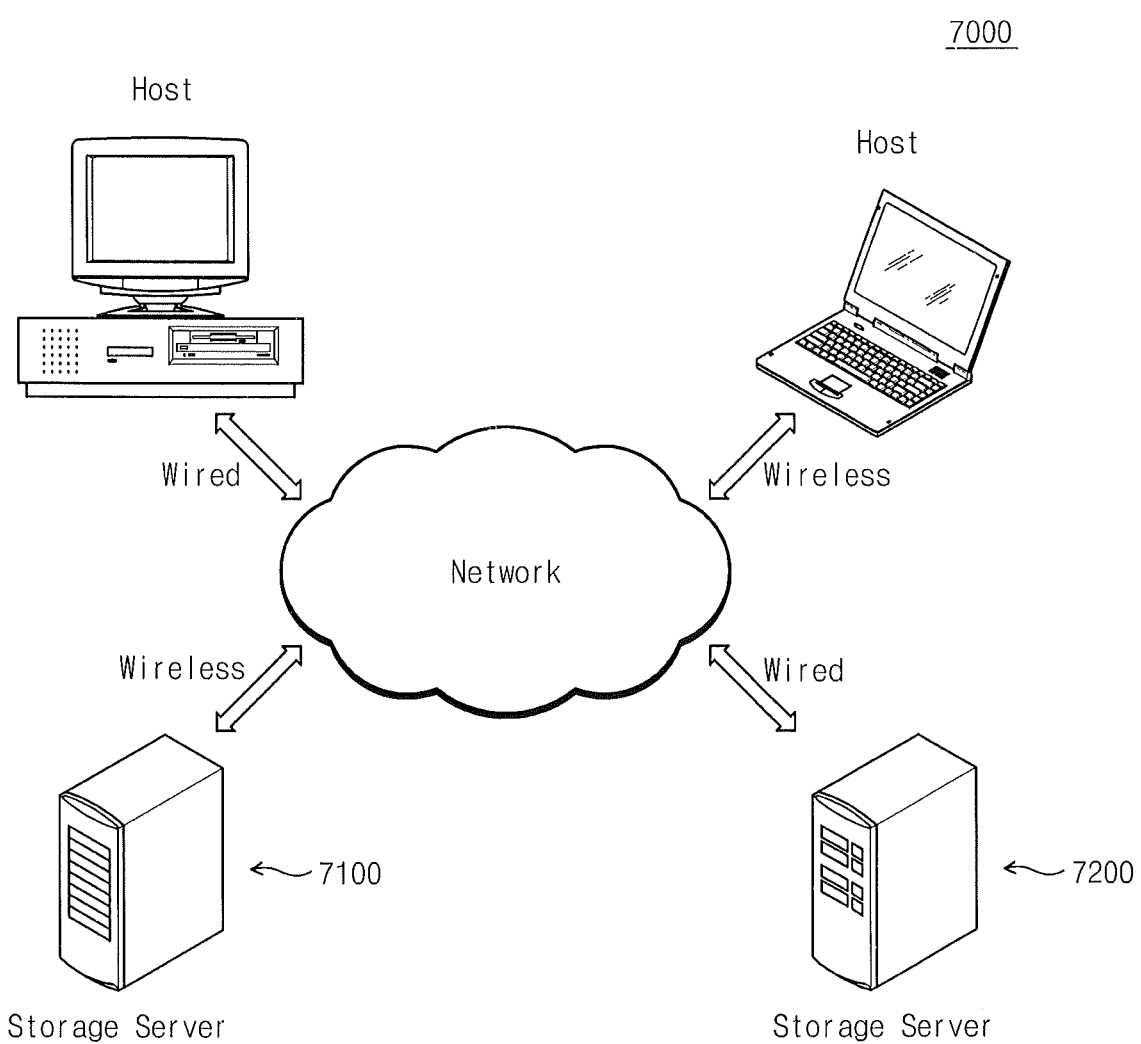
Figure 17:
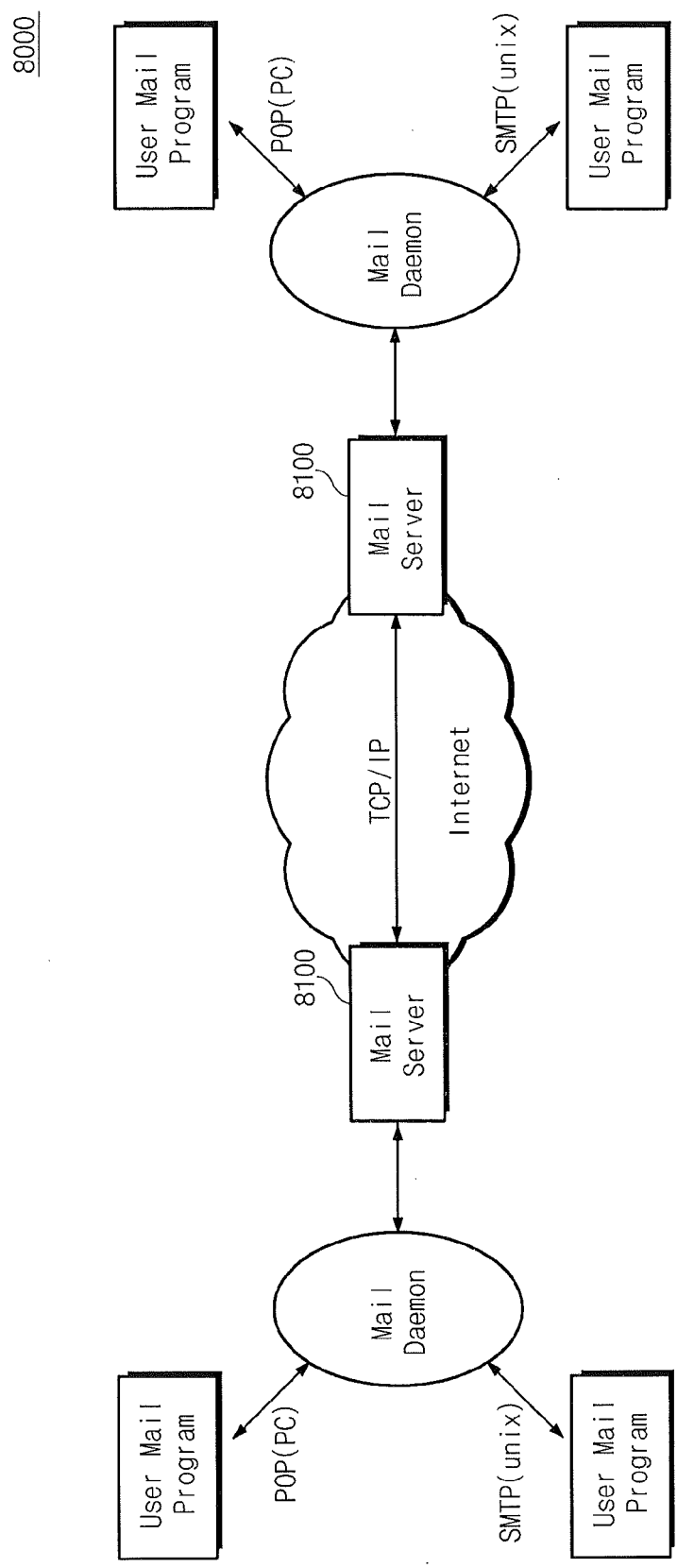

FIGS. 15 to 17 are diagrams schematically illustrating systems to which a data storage device according to embodiments of the inventive subject matter is applied.

In the event that a solid state drive including a data storage device formed of a memory controller and a multi-bit memory device according to embodiments of the inventive subject matter is applied to the storage, as illustrated in FIG. 15, a system 6000 includes a storage apparatus 6100 which communicates with a host by a wire or wireless manner. In a case where a solid state drive including a data storage device according to embodiments of the inventive subject matter is applied to a storage server, as illustrated in FIG. 16, a system 7000 includes a storage servers 7100 and 7200 which communicate with a host by a wire or wireless manner. Further, as illustrated in FIG. 17, a solid-state drive including a data storage device according to embodiments of the inventive subject matter can be applied to a mail server 8100.

Figure 18:
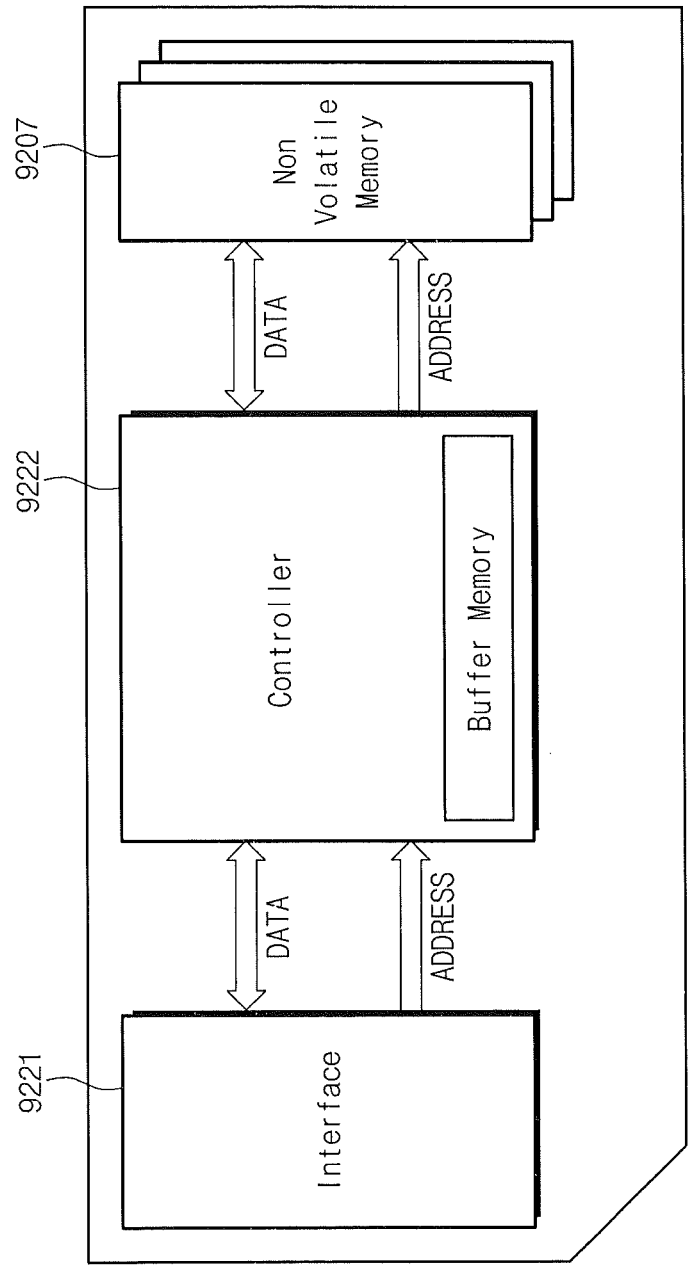
FIG. 18 is a block diagram schematically illustrating a memory card according to some embodiments of the inventive subject matter.

FIG. 18 is a block diagram schematically illustrating a memory card according to some embodiments of the inventive subject matter. A memory card, for example, may be an MMC card, an SD card, a multiuse card, a micro-SD card, a memory stick, a compact SD card, an ID card, a PCMCIA card, an SSD card, a chip-card, a smartcard, an USB card, or the like.

Referring to FIG. 18, the memory card may include an interface circuit 9221 for interfacing with an external device, a controller 9222 including a buffer memory and controlling an operation of the memory card and at least one nonvolatile memory device 9207. The controller 9222 may be a processor that is configured to control write and read operations of the nonvolatile memory device 9207. The controller 9222 may be coupled with the nonvolatile memory device 9207 and the interface circuit 2221 via a data bus and an address bus. The nonvolatile memory device 9207 may be formed of a memory described in FIG. 1 and may perform a program operation using one of program methods described in relation to FIGS. 3 to 9. Accordingly, it is possible to slow down a junction field generated toward a string selection line side from a string channel As the junction field is slowed down, there may be reduced a leakage current causing lowering of a boosted voltage of a channel. As a result, it is possible to prevent a program-inhibited memory cell from being programmed.

Figure 19:
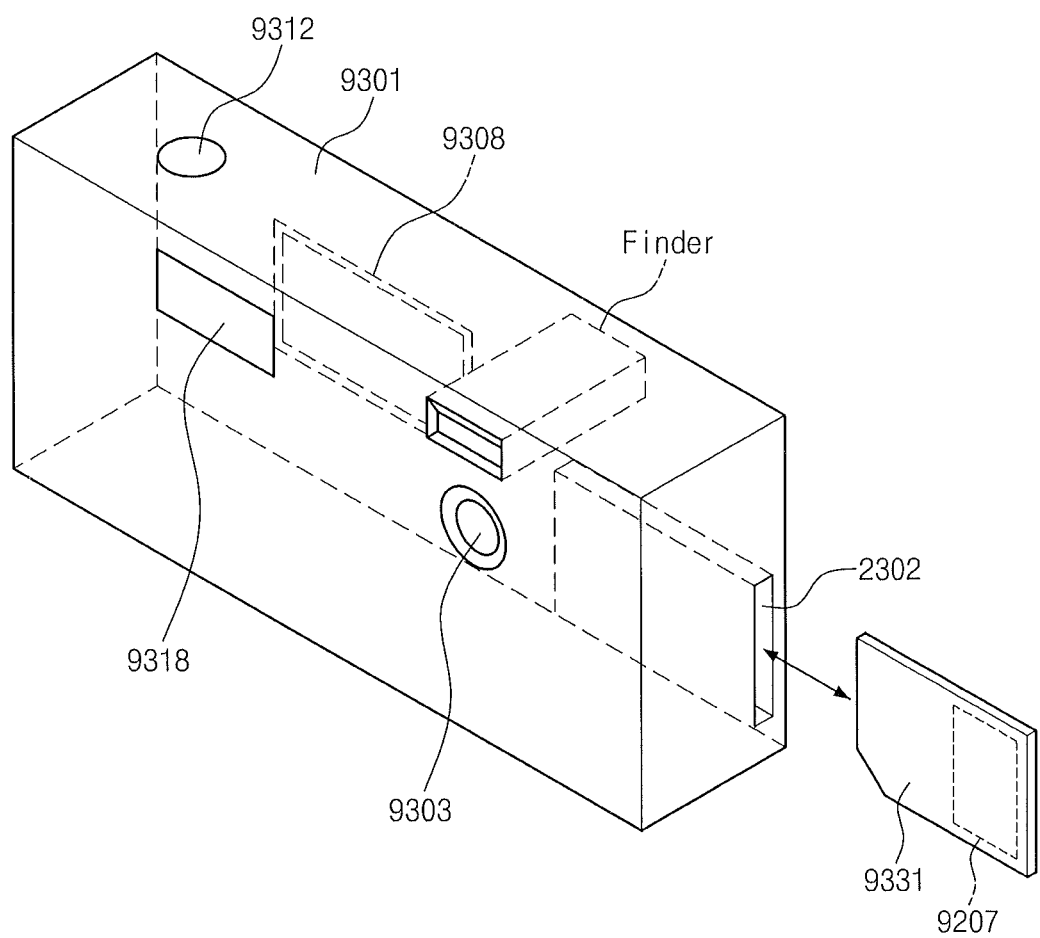
FIG. 19 is a block diagram schematically illustrating a digital still camera according to some embodiments of the inventive subject matter.

FIG. 19 is a block diagram schematically illustrating a digital still camera according to some embodiments of the inventive subject matter.

Referring to FIG. 19, a digital still camera may include a body 9301, a slot 2302, a lens 9303, a display circuit 9308, a shutter button 9312, a strobe 9318, and the like. A memory card 9331 may be inserted in the slot 9308 and may include a memory controller and a nonvolatile memory device. A nonvolatile memory device in the memory card 9331 may be formed of a memory described in FIG. 1 and may perform a program operation using one of program methods described in relation to FIGS. 3 to 9. Accordingly, it is possible to slow down a junction field generated toward a string selection line side from a string channel. As the junction field is slowed down, there may be reduced a leakage current causing lowering of a boosted voltage of a channel. As a result, it is possible to prevent a program-inhibited memory cell from being programmed.

If the memory card 9331 has a contact type, an electric circuit on a circuit board may be electrically contacted with the memory card 9331 when it is inserted in the slot 2302. In the event that the memory card 9331 has a non-contact type, an electric circuit on a circuit board may communicate with the memory card 9331 in a radio-frequency manner.

Figure 20:
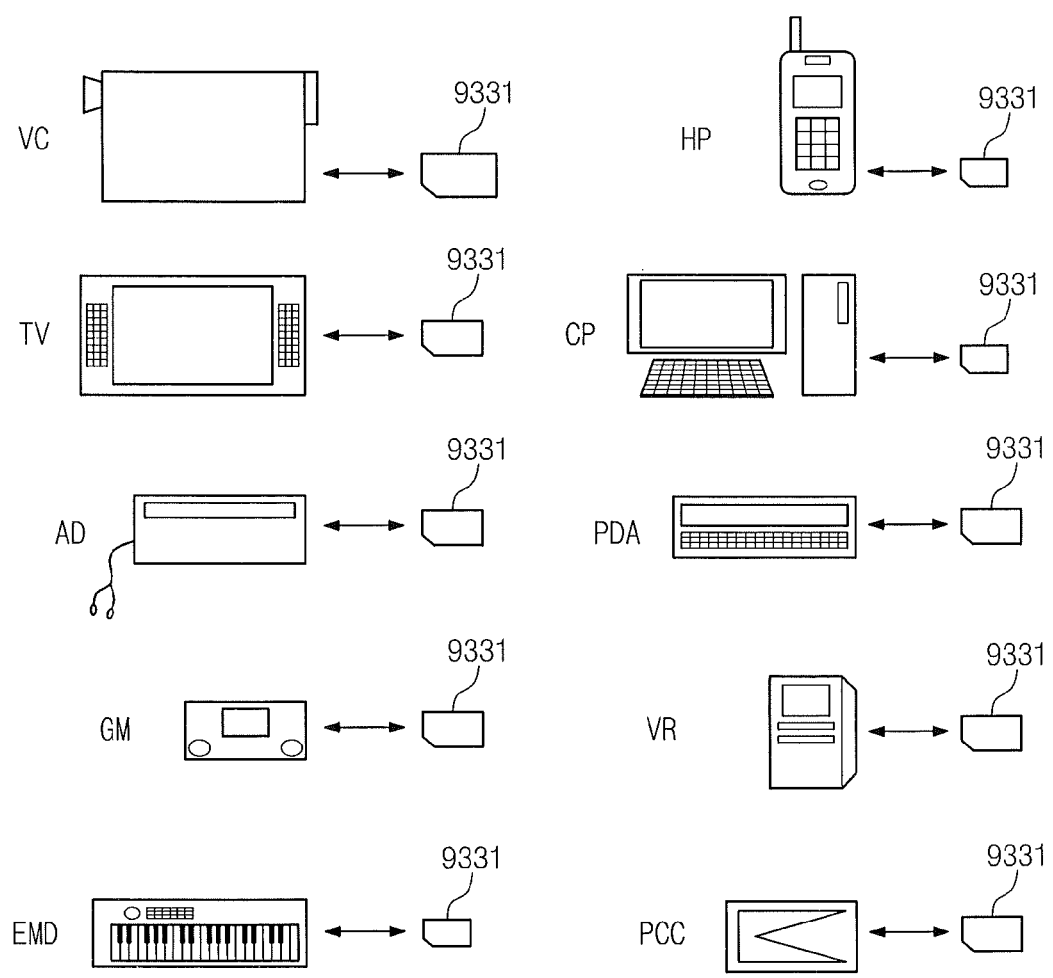
FIG. 20 is a diagram schematically illustrating various systems to which a memory card in FIG. 19 is applied.

FIG. 20 is a diagram schematically illustrating various systems to which a memory card in FIG. 19 is applied.

Referring to FIG. 20, a memory card 9331 may be applied to a video camera VC, a television TV, an audio device AD, a game machine GM, an electronic music device EMD, a cellular phone HP, a computer CP, a Personal Digital Assistant (PDA), a voice recorder VR, a PC card PCC, and the like.

In example embodiment, memory cells can be formed of a variable resistance memory cell. An exemplary variable resistance memory cell and a memory device including the same are disclosed in U.S. Pat. No. 7,529,124, the entirety of which is incorporated by reference herein.

In other example embodiments, memory cells can be formed of one of various cell structures having a charge storage layer. Cell structures having a charge storage layer include a charge trap flash structure using a charge trap layer, a stack flash structure in which arrays are stacked at multiple layers, a source-drain free flash structure, a pin-type flash structure, etc.

In still other example embodiments, a memory device having a charge trap flash structure as a charge storage layer is disclosed in U.S. Pat. No. 6,858,906 and U.S. Patent Publication Nos. 2004/0169238 and 2006/0180851, the entirety of which is incorporated by reference herein. A source-drain free flash structure is disclosed in KR Patent No. 673020, the entirety of which is incorporated by reference herein.

A non-volatile memory device and/or a memory controller according to the inventive subject matter may be packed using various types of packages. For example, A non-volatile memory device or a memory controller according to the inventive subject matter may be packed using packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

The above-disclosed subject matter is to be considered illustrative and not restrictive and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents and shall not be restricted or limited by the foregoing detailed description.

What is claimed is:

1. A method of operating a nonvolatile memory device having a plurality of strings of memory cells, respective bit lines coupled to respective ones of the strings, and a plurality of word lines coupled to the strings, the method comprising:
    applying a bit line program voltage to at least one selected bit line and a bit line program-inhibition voltage to at least one unselected bit line; and
    concurrently applying a word line program voltage to a selected word line, a first pass voltage to at least one unselected word line, a second pass voltage less than the first pass voltage to at least one unselected word line immediately adjacent the selected word line on a string selection line side of the selected word line, and a third pass voltage greater than the first pass voltage to at least one unselected word line immediately adjacent the selected word line on a ground selection line side of the selected word line.

2. The method of claim 1, wherein a junction field formed toward a bit line side from a string channel is reduced by the second and third pass voltages.

3. The method of claim 1, wherein the third pass voltage reduces local boosting of a channel of a memory cell connected to the selected word line.

4. The method of claim 1, wherein applying a third pass voltage greater than the first pass voltage to at least one unselected word line immediately adjacent the selected word line on a ground selection line side of the selected word line comprises applying the third voltage to at least two unselected word lines immediately adjacent the selected word line.

5. The method of claim 4, further comprising performing a local self-boosting to at least one unselected word line.

6. The method of claim 1, further comprising applying a dummy word line voltage less than or equal to the second pass voltage to a dummy word line on the string selection line side of the selected word line.

7. A method of operating a nonvolatile memory device which includes a plurality of strings of memory cells, respective bits lines coupled to respective ones of the strings, and a plurality of word lines coupled to the strings, the method comprising:
applying a bit line program voltage to at least one selected bit line and a bit line program-inhibition voltage to at least one unselected bit line; and
concurrently applying a word line program voltage to a selected word line, a first pass voltage to at least one unselected word line, a second pass voltage greater than the first pass voltage to at least one unselected word line immediately adjacent the selected word line on a ground selection line side of the selected word line, and a third pass voltage less than the first pass voltage to at least one unselected word line immediately adjacent the selected word line on a string selection line side of the selected word line.

8. The method of claim 7, wherein a junction field formed toward a bit line side from a string channel is reduced by the second and third pass voltages.

9. The method of claim 7, wherein the third pass voltage reduces local boosting of a channel of a memory cell connected to the selected word line.

10. The method of claim 7, further comprising applying a dummy word line voltage less than or equal to the second pass voltage to a dummy word line on the string selection side of the selected word line.

11. A method of operating a nonvolatile memory device having a plurality of strings of memory cells, respective bits lines coupled to respective ones of the strings, and a plurality of word lines coupled to the strings, the method comprising:
applying a bit line program voltage to at least one selected bit line and a bit line program-inhibition voltage to at least one unselected bit line; and
concurrently applying a word line program voltage to a selected word line, a first pass voltage to a first unselected word line and respective second and third pass voltages different from the first pass voltage to respective unselected second and third word lines immediately adjacent the selected word line on respective ones of a string selection line side of the selected word line and a ground selection line side of the selected word line, wherein the second pass voltage is less than the first pass voltage and wherein the third pass voltage is greater than the first pass voltage.

12. The method of claim 11, wherein concurrently applying a word line program voltage to a selected word line, a first pass voltage to a first unselected word line and respective second and third pass voltages different from the first pass voltage to respective unselected second and third word lines immediately adjacent the selected word line on respective ones of a string selection line side of the selected word line and a ground selection line side of the selected word line comprises concurrently applying the word line program voltage to the selected word line, the first pass voltage to the first unselected word line, the second pass voltage to the second unselected word lines, the third pass voltage to the third unselected word line, and a dummy word line voltage less than or equal to the second pass voltage to a dummy word line disposed on the string selection side of the selected word line.

13. The method of claim 11, wherein concurrently applying a word line program voltage to a selected word line, a first pass voltage to a first unselected word line and respective second and third pass voltages different from the first pass voltage to respective unselected second and third word lines immediately adjacent the selected word line on respective ones of a string selection line side of the selected word line and a ground selection line side of the selected word line comprises concurrently applying the word line program voltage to the selected word line, the first pass voltage to the first unselected word line, the second pass voltage to the second unselected word lines, the third pass voltage to the third unselected word line, and a local boosting word line voltage to an unselected word line on the ground selection line side of the selected word line.

* * * * *